(12) United States Patent
Kikuchi et al.

(10) Patent No.: US 9,391,295 B2
(45) Date of Patent: Jul. 12, 2016

(54) ORGANIC EL DISPLAY APPARATUS (71) Applicant: Sharp Kabushiki Kaisha, Osaka (JP)

(72) Inventors: Katsuhiro Kikuchi, Osaka (JP);
Shinichi Kawato, Osaka (JP); Takashi Ochi, Osaka (JP); Manabu Niboshi, Osaka (JP); Yuto Tsukamoto, Osaka (JP); Tomohiro Kosaka, Osaka (JP);
Tomofumi Osaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 6 days.

(21) Appl. No.: 14/397,902

(22) PCT Filed: Apr. 10, 2013

(86) PCT No.: PCT/JP2013/002439
§ 371 (c)(1),
(2) Date: Oct. 30, 2014

(87) PCT Pub. No.: WO2013/171966
PCT Pub. Date: Nov. 21, 2013

(65) Prior Publication Data
US 2015/0123092 A1 May 7, 2015

(30) Foreign Application Priority Data

May 14, 2012 (JP) .................................. 2012-110476

(51) Int. Cl.
*H01L 51/52* (2006.01)
*H01L 27/32* (2006.01)

(52) U.S. Cl.
CPC ............ *H01L 51/5253* (2013.01); *H01L 27/32* (2013.01); *H01L 51/524* (2013.01); *H01L 51/5246* (2013.01); *H01L 27/322* (2013.01)

(58) Field of Classification Search
CPC .................................................... H01L 51/5246
See application file for complete search history.

(56) References Cited

U.S. PATENT DOCUMENTS

| 8,063,562 | B2 * | 11/2011 | Gomi | H01L 51/5243 313/498 |
| 2003/0058390 | A1 * | 3/2003 | Fujii | G02B 5/045 349/113 |
| 2004/0263740 | A1 | 12/2004 | Sakakura et al. | |
| 2005/0285522 | A1 | 12/2005 | Han et al. | |
| 2007/0171637 | A1 * | 7/2007 | Choi | H01L 51/5237 362/227 |
| 2008/0252839 | A1 | 10/2008 | Nakadaira | |
| 2014/0307407 | A1 * | 10/2014 | Han | G02F 1/1339 361/784 |

FOREIGN PATENT DOCUMENTS

| JP | 2005-38842 A | 2/2005 |
| JP | 2006-4909 A | 1/2006 |

(Continued)

Primary Examiner — Robert Carpenter
(74) Attorney, Agent, or Firm — Chen Yoshimura LLP (57) ABSTRACT An organic EL display device is provided with: an organic EL element, which is formed on an insulating substrate, and which is provided between the insulating substrate and an insulating substrate; a sealing material, which is provided in a frame region, and which is sandwiched between the insulating substrate and the insulating substrate to bond the insulating substrates to each other; and a wall member, which is provided in the frame region by being adjacent to the outer face side of the sealing material, and which forms level differences in the sealing material so as to make the height of the outer face side of the sealing material small.

18 Claims, 5 Drawing Sheets

(56) References Cited

FOREIGN PATENT DOCUMENTS

| | | |
|---|---|---|
| JP | 2006-86085 A | 3/2006 |
| JP | 2008-262796 A | 10/2008 |
| JP | 2011-227275 A | 11/2011 |

* cited by examiner

ORGANIC EL DISPLAY APPARATUS

TECHNICAL FIELD

The present invention is related to an organic EL display device provided with an organic electroluminescent element (hereinafter, organic EL element).

BACKGROUND ART

Recently, organic EL display devices are gaining attention as a next generation flat panel display device such as those with full color display. The demand is rising for this organic EL display device, which is a self-luminescent display device having excellent viewing angles, good visual characteristics, low power consumption, and can be made thin.

This organic EL display device has a plurality of organic EL elements that are arranged in prescribed arrays, and the respective organic EL elements are provided with a first electrode (positive electrode) formed on the substrate with insulating characteristics, an organic layer having a light-emitting layer formed on the first electrode, and a second electrode (negative electrode) formed on the organic layer.

In general, the light-emitting properties of the organic EL element such as brightness and evenness are significantly lowered as compared to the initial state after the organic EL element is driven for a period of time. The causes of such deteriorations in light-emitting properties include the deterioration of the organic layer caused by the moisture in the outside air entering the inside of the organic EL element, and the peeling off or the like occurring between the organic layer and the electrode occurring due to the moisture.

Thus, an organic EL display device provided with a sealing member to protect the organic EL element from moisture is being proposed. More specifically, what is proposed is an organic EL display device provided with an organic EL element constituted of a first electrode, an organic light-emitting layer, and a second electrode stacked on a substrate, and a sealing member having water absorbing characteristics (sealing member formed of an ultraviolet curable resin such as an epoxy resin, for example) disposed on the periphery of the substrate at a gap from the organic light-emitting layer. The organic EL display device has a structure in which the height (vertical length) of the sealing member increases towards the outer edge of the substrate from the organic light-emitting layer side. It is disclosed that by having this type of sealing member, water entering from outside the device can be prevented and the deterioration of the organic layer can be suppressed (see Patent Document 1, for example).

RELATED ART DOCUMENT

Patent Document

Patent Document 1: Japanese Patent Application Laid-Open Publication No. 2006-86085

SUMMARY OF THE INVENTION

Problems to be Solved by the Invention

In general, the moisture absorbing speed of a material having moisture absorbing characteristics increases proportionally to the area in contact with the air having moisture, and thus the time in which the amount of vapor in the sealing member reaches its limit (saturated vapor) for a material having this type of moisture absorbing characteristics will be inversely proportional to the area in contact between the air having moisture and the sealing member (in other words, as the contact area increases, the time needed to reach the limit is shortened).

Then, if the amount of vapor in the sealing member reaches its limit (saturated vapor), then the moisture absorbing characteristics of the sealing member no longer functions, and thus the shielding property against the air having moisture decreases, and as a result, the moisture in the outside air enters the inside of the organic EL element.

As mentioned above, an organic EL display device disclosed in Patent Document 1 has a configuration in which the height of the sealing member increases towards the outer edge of the substrate from the organic light-emitting layer side, and thus the contact area between the air having moisture and the sealing member is large. Therefore, because the time in which the amount of vapor in the sealing member reaches its limit (saturated vapor) is short, it is difficult to maintain the moisture absorbing performance of the sealing member for a long period of time, and as a result, there was a problem in that the properties of the organic EL element deteriorate in a short period of time.

The present invention is made in view of the above-mentioned problems, and the object thereof is to provide an organic EL display device that can prevent the characteristic degradation of the organic EL display element caused by moisture for a long period of time.

Means for Solving the Problems

In order to achieve the above-mentioned goals, an organic electroluminescent display device of the present invention includes: a first substrate; a second substrate facing the first substrate; an organic electroluminescent element formed on the first substrate on a side facing the second substrate; a sealing member sandwiched between the first substrate and the second substrate to bond the first substrate to the second substrate, the sealing member being disposed in a frame region that is defined at a periphery of a display region of the organic electroluminescent display device performing image display; and a wall member provided on at least one of the first substrate in the frame region and the second substrate in the frame region, the wall member being disposed adjacent (attached) to an outer face of the sealing member so as to form a level difference in height of the sealing member such that a vertical length of the sealing member exposed to an exterior from the wall member is shorter than an entire height of the sealing member between the first substrate and the second substrate.

According to the same configuration, because the height of the sealing member on the outer face can be even shorter, the area of the contact surface between the sealing member and the air holding moisture can be further reduced. Therefore, it is possible to prolong the time in which the amount of vapor in the sealing member reaches its limit (saturated vapor), and the moisture absorbing characteristics of the sealing member can be maintained for a long period of time, and as a result, characteristic degradation of the organic EL element caused by moisture can be prevented.

The organic electroluminescent display device of the present invention, wherein the wall member is provided on each of the first and second substrates, respectively designated as a first wall member provided on the first substrate and a second wall member on the second substrate, and wherein the outer face of the sealing member may be sandwiched by the first wall member and the second wall member.

According to the same configuration, because the height of the sealing member on the outer face becomes shorter, the contact surface with the air holding moisture can be reduced. Therefore, it is possible to further prolong the time needed for the amount of vapor in the sealing member to reach its limit (saturated vapor).

The organic electroluminescent display device in the present invention may further include an interlayer insulating film between the first substrate and the organic electroluminescent element, wherein the first wall member may be formed of a material used to form the interlayer insulating film.

According to the same configuration, a first wall member can be made without using new materials and be formed of a low cost material with broad utility. Furthermore, because the first wall member can be formed simultaneously with the interlayer insulating film, the first wall member can be formed without increasing the number of steps involved.

The organic electroluminescent display device of the present invention may further include a colored layer and a black matrix disposed on the second substrate on a side facing the organic electroluminescent element, wherein the second wall member may be formed of a material forming the colored layer or the black matrix.

According to the same configuration, a second wall member can be made without using new materials and be formed of a low cost material with broad utility. Furthermore, because the second wall member can be formed simultaneously with the colored layer and the black matrix, the second wall member can be formed without increasing the number of steps involved.

The organic electroluminescent display device of the present invention may further include: an inorganic film interposed between the sealing member and the first wall member; and another inorganic film interposed between the sealing member and the second wall member.

According to the same configuration, the characteristic degradation of the organic EL element caused by moisture can be further prevented for a long period of time because the inorganic film can prevent the moisture absorbed by the first and second wall members from entering.

The organic electroluminescent display device of the present invention, wherein the inorganic film is formed of one material chosen from a group consisting of silicon oxide, silicon nitride, silicon nitride oxide, and silicon oxide nitride.

According to the same configuration, the characteristic degradation of the organic EL element can be reliably prevented without increasing the thickness of the inorganic film.

Effects of the Invention

According to the present invention, an organic EL display device having a sealing member for blocking moisture can maintain the moisture absorbing characteristics of the sealing member for a long period of time, and the characteristic degradation of the organic EL element caused by moisture can be prevented.

DETAILED DESCRIPTION OF EMBODIMENTS

Embodiment 1

Embodiments of the present invention will be described in detail below with reference to drawings. The present invention is not limited to the embodiments below.

Figure 1:
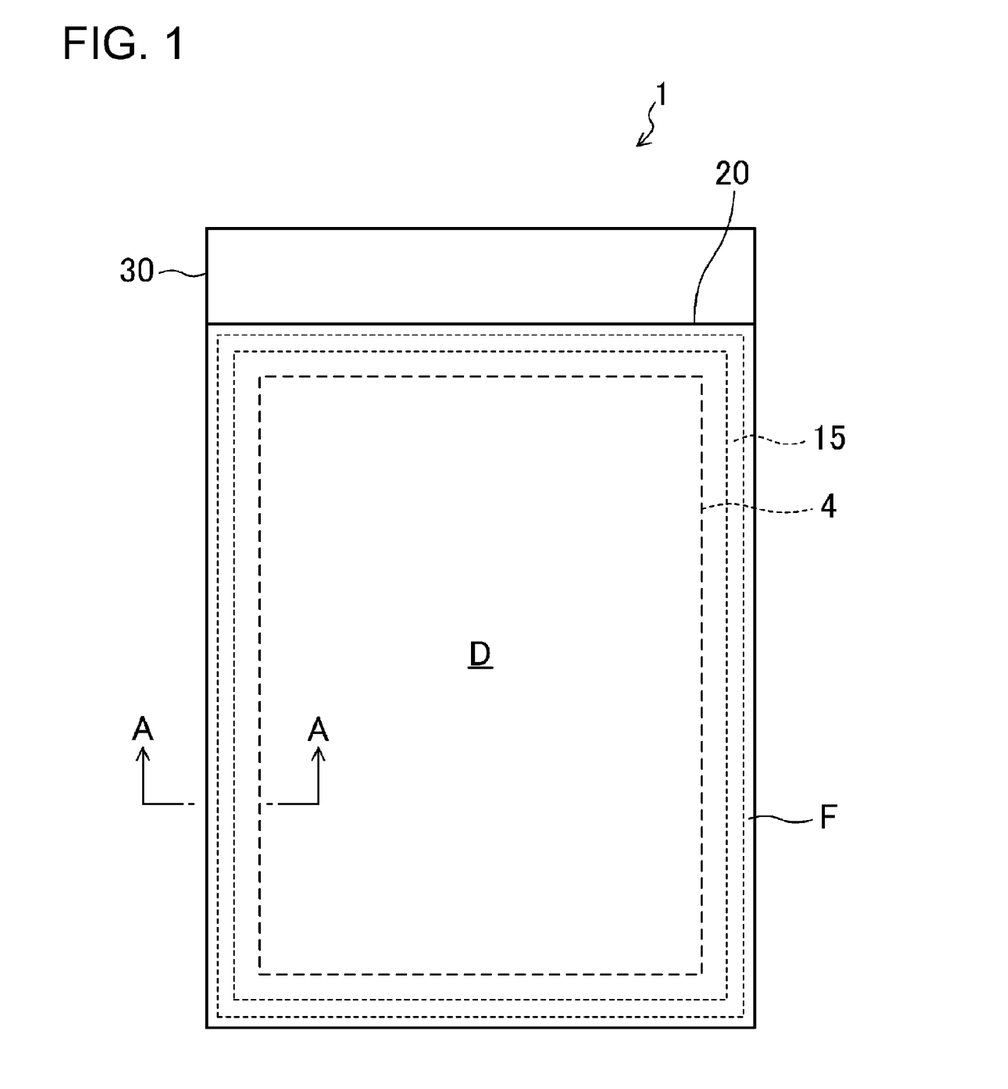
FIG. 1 is a plan view of an organic EL display device according to Embodiment 1 of the present invention.
Figure 2:
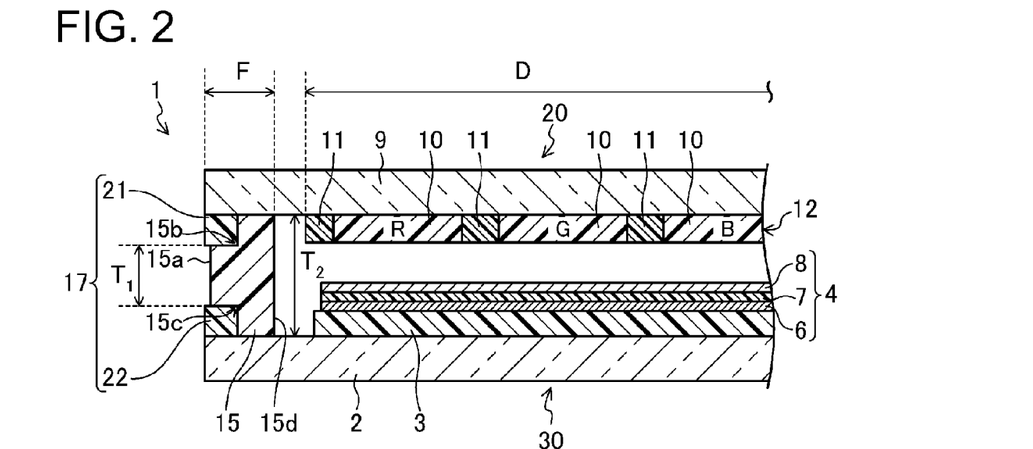
FIG. 2 is a cross-sectional view along the line A-A of FIG. 1.
Figures 3, 4:
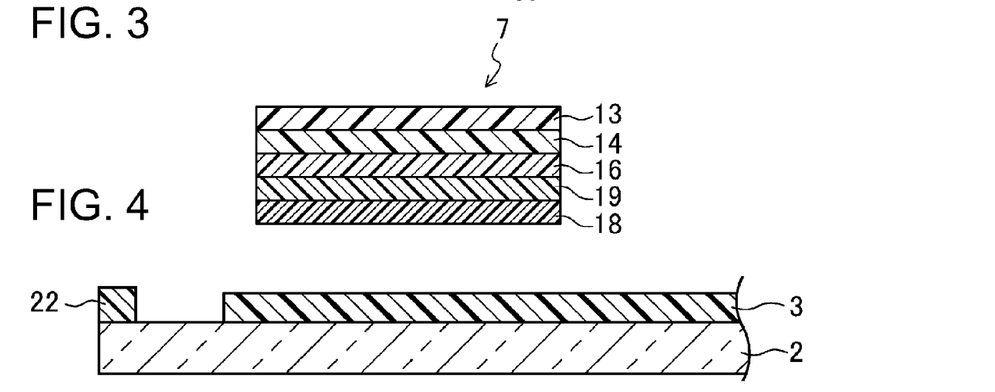
FIG. 3 is a cross-sectional view for describing an organic layer forming an organic EL element included in an organic EL display device related to Embodiment 1 of the present invention.
FIG. 4 is a cross-sectional view for describing the manufacturing process of an organic EL display device according to Embodiment 1 of the present invention.

FIG. 1 is a plan view of an organic EL display device related to Embodiment 1 of the present invention and FIG. 2 is a cross-sectional view along the line A-A of FIG. 1. FIG. 3 is a cross-sectional view for describing an organic layer forming an organic EL element included in an organic EL display device related to Embodiment 1 of the present invention.

As shown in FIGS. 1 and 2, an organic EL display device 1 is provided with an element substrate 30, a sealing substrate 20 that faces the element substrate 30, and organic EL elements 4 formed on the element substrate 30 and provided between the element substrate 30 and the sealing substrate 20.

As shown in FIGS. 1 and 2, the element substrate 30 has a display region D in which the organic EL elements 4 are arranged. In this display region D, on a surface thereof on the element substrate 30 side facing the sealing substrate 20, the organic EL elements 4 are arranged in a matrix.

As shown in FIG. 2, the element substrate 30 is provided with an insulating substrate 2 such as a glass substrate, an interlayer insulating film 3 provided on the insulating substrate 2, and the organic EL elements 4 provided on the interlayer insulating film 3.

The interlayer insulating film 3 is formed of an acrylic photosensitive resin or the like, and is formed by photolithography, for example.

The element substrate 30 has a plurality of gate lines (not shown) on the insulating substrate 2 extending so as to be parallel to each other, a plurality of source lines (not shown) extending so as to be parallel to each other and perpendicular to the respective gate lines, a plurality of TFTs (not shown) respectively provided on the respective intersections of the gate lines and the source lines, and a plurality of pixel electrodes (not shown) connected to the respective TFTs.

As shown in FIG. 2, the sealing substrate 20 is provided with an insulating substrate 9 such as a glass substrate and a color filter layer 12 provided on the insulating substrate 9. The color filter layer 12 has a plurality of colored portions respectively corresponding to the pixel electrodes on the element substrate 30 and being respectively colored red, green, and blue, and also has a black matrix 11 adjacent to the respective colored portions 10.

Furthermore, the sealing substrate 20 is provided with a common electrode (not shown) disposed on the color filter layer 12.

A function of the black matrix 11 is to delineate the plurality of colored portions 10, and the black matrix 11 is formed of a metal material such as Ta (tantalum), Cr (chromium), Mo (molybdenum), Ni (nickel), Ti (titanium), Cu (copper), or Al (aluminum), a resin material that has black pigment such as carbon dispersed therein, or a resin material or the like having a colored layer with a plurality of colors and light transmittance.

Furthermore, as shown in FIG. 2, the organic EL element 4 is provided with a first electrode 6 (positive electrode) disposed on the surface of the interlayer insulating film 3, an organic layer 7 provided on the surface of the first electrode 6, and a second electrode 8 (negative electrode) provided on a surface of the organic layer 7.

A plurality of the first electrodes 6 are formed on the surface of the element substrate 30 in a matrix with prescribed gaps therebetween, and the respective first electrodes 6 form the respective pixel regions of the organic EL display device 1. The first electrodes 6 are formed of Au, Ni, Pt, ITO (indium zinc oxide), or a multilayer film or the like of ITO and Ag, for example.

The organic layer 7 is formed on the surface of the respective first electrodes 6 delineated in a matrix. As shown in FIG. 3, this organic layer 7 is provided with a hole injection layer 18, a hole transport layer 19 formed on a surface of the hole injection layer 18, a light-emitting layer 16 formed on a surface of the hole transport layer 19 emitting either red, green, or blue light, an electron transport layer 14 formed on a surface of the light-emitting layer 16, and an electron injection layer 14 formed on a surface of the electron transport layer 14. The organic layer 7 is formed by stacking the hole injection layer 18, hole transport layer 19, the light-emitting layer 16, the electron transport layer 14, and the electron injection layer 13 in this order.

The hole injection layer 18 is for increasing the injection efficiency of holes in the light emitting layer 16. The material that can be used to form the hole injection layer 18 includes: benzene; styrylamine; triphenylamine; porphyrin; triazole; imidazole; oxadiazole; polyarylalkane; phenylenediamine; arylamine; oxazole; anthracene; fluorenone; hydrazine; stilbene; triphenylene; azatriphenylene; a derivative of these; a polysilane compound; a vinylcarbazole compound; a thiophene-based compound; or a monomer, an oligomer, or a polymer of a heterocyclic conjugated system such as an aniline compound.

The hole transport layer 19, similar to the hole injection layer 18, is for increasing the injection efficiency of holes in the light-emitting layer 16, and the material used to form the hole transport layer 19 can be similar to that used for the hole injection layer 18.

When voltage is applied by the first electrode 6 and the second electrode 8, the two electrodes respectively injects holes and electrons into the light emitting layer 16 that is a region where the holes and the electrons are recombined. This light-emitting layer 16 is formed of materials with high light-emitting efficiency, and formed of low molecular weight fluorescent pigment, a fluorescent polymer, or an organic material such as a metal complex, for example.

More specifically, the light-emitting layer 16 can be formed of: anthracene; naphthalene; indene; phenanthrene; pyrene; naphthacene; triphenylene; anthracene; perylene; picene; fluoranthene; acephenanthrylene; pentaphene; pentacene; coronene; butadiene; coumarin; acridine; stilbene; a derivative of these; tris(8-quinolinolato)aluminum complex; bis(benzoquinolate)beryllium; tris (dibenzoylmethanido) (o-phenanthroline)-europium(III) complex; or a 4,4'-bis-(2, 2-di-p-tryl-vinyl)-biphenyl.

The electron transport layer 14 is for transporting the electrons injected from the second electrode 8 to the light-emitting layer 16. The material forming the electron transport layer 14 can be the following: quinoline; perylene; phenanthroline; bisstryl; pyrazine; triazole; oxazole; oxadiazole; fluorenone; or a derivative or a metal complex of these.

More specifically, the material can be tris(8-quinolinyloxy) aluminum, anthracene, naphthalene, phenanthrene, pyrene, anthracene, perylene, butadiene, a coumarin, acridine, stilbene, 1,10-Phenanthroline, a derivative of these, or a metal complex of these.

The electron injection layer 13, similar to the electron transport layer 14, is for transporting the electrons injected from the second electrode 8 to the light-emitting layer 16, and the material forming the electron injection layer 13 can be similar to that used for the electron transport layer 14.

The second electrode 8 has a feature to inject electrons into the organic layer 7. This second electrode 8 is formed of a magnesium alloy (MgAg or the like), an aluminum alloy (AlLi, AlCa, AlMg, or the like), a metal calcium, a metal with a small work function, or the like.

Furthermore, as shown in FIGS. 1 and 2, the organic EL display device 1 has a frame region F defined, and the sealing member 15 will be disposed thereon so as to surround the display region D.

As shown in FIG. 2, the sealing member 15 is sandwiched between the element substrate 30 and the sealing substrate 20 and the element substrate 30 and the sealing substrate 20 are bonded to each other through the sealing member 15. As shown in FIG. 1, the sealing member 15 is formed in a frame shape so as to seal the organic EL element 4.

The material used for the sealing member 15 has moisture absorbing characteristics, and the configuration of the present embodiment uses an acrylic resin, an ultraviolet curable resin such as an epoxy resin or a thermosetting resin, for example.

A shown in FIG. 2, the present embodiment is characterized by having the wall member 17 embedded in a portion of the frame region F of the organic EL display device in an outer face 15a side of the sealing member 15 (in other words, the contact surface with air holding moisture), in order to reduce the size of the portion of the sealing member 15 exposed to the air.

More specifically, the present embodiment is characterized by having the wall member 17 in the frame region F of the organic EL display device 1 so as to be adjacent to the outer face 15a (surface on the opposite side to the organic EL element 4) of the sealing member 15, and the wall member 17 includes the level differences 15b and 15c in the sealing member 15 such that the height of the sealing member 15 becomes short at the outer face 15a side.

This wall member 17, in the frame region F, is formed of a first wall member 22 provided on the element substrate 30 and a second wall member 21 provided on the sealing substrate 20.

As shown in FIG. 2, the sealing member 15 is formed in a step shape due to the wall member 17, and at the side of the sealing member 15 contacting the air, the level differences 15b and 15c are formed such that a height $T_1$ becomes shorter at the outer face 15a side of the sealing member 15.

Thus, the contact area of the sealing member 15 with air holding moisture can be reduced, because the height $T_1$ on the outer face 15a side of the sealing member 15 becomes short. Therefore, it is possible to increase the time that it takes for the amount of vapor in the sealing member to reach its limit (saturated vapor), and the moisture absorbing characteristics of the sealing member 15 can be maintained for a long period of time, and as a result, characteristic degradation of the organic EL element 4 caused by moisture can be prevented for a long period of time.

Furthermore, in the present embodiment, the second wall member 21 is formed of the same material as the black matrix 11, and the first wall member 22 is formed of the material forming the interlayer insulating film 3. Therefore, the wall member 17 can be made without using new materials and be formed of a low cost material with broad utility.

Next, an example of a method of manufacturing the present embodiment for an organic EL display device will be described. FIGS. 4 to 8 are cross-sectional views for explaining the manufacturing process of an organic EL display device according to Embodiment 1 of the present invention.

<Interlayer Insulating Film/First Wall Member Forming Process>

First, as shown in FIG. 4, a glass substrate is prepared as the insulating substrate 2, for example. Next, on the insulating substrate 2, the gate lines, the source lines, the TFTs, the pixel electrodes, and the like are patterned. Then, an acrylic photosensitive resin is applied, and after the applied photosensitive resin is exposed through a photomask, patterning through development takes place. As shown in FIG. 4, then the interlayer insulating film 3 and the first wall member 22 are formed so as to have a thickness of 2.5 μm on the insulating substrate 2, for example.

In this manner, in the present embodiment, the first wall member 22 can be formed simultaneously with the interlayer insulating film 3, and thus the first wall member 22 can be formed without increasing the number of steps.

<Organic EL Element Forming Process>

Figure 5:
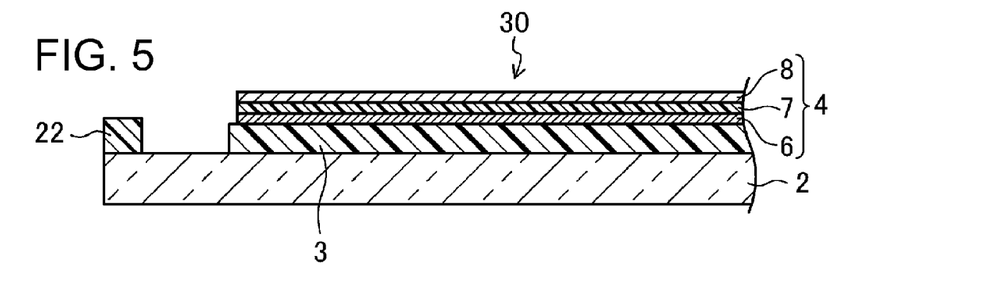
FIG. 5 is a cross-sectional view for describing the manufacturing process of an organic EL display device according to Embodiment 1 of the present invention.

Next, on the interlayer insulating film 3 formed on the insulating substrate 2, the ITO film is patterned by sputtering to form the first electrode 6. At this time, the film thickness of the first electrode 6 is formed so as to be approximately 150 nm, for example.

Next, on the first electrode 6, the organic layer 7 including the light emitting layer 16 and the second electrode 8 are formed by vapor deposition using a metal mask.

More specifically, first, the insulating substrate 2 provided with the first electrode 6 is placed in the chamber of the deposition apparatus. The inside of the chamber of the deposition apparatus is kept at a vacuum of $1 \times 10^{-5}$ to $1 \times 10^{-4}$ (Pa) by a vacuum pump. Furthermore, the insulating substrate 2 provided with the first electrode 6 is disposed in a state in which two sides thereof are fixed by a pair of substrate receivers attached inside the chamber.

Then, as shown in FIG. 5, the hole injection layer 18, the hole transport layer 19, the light-emitting layer 16, the electron transport layer 14, and the respective vapor deposition materials of the electron injection layer 13 are evaporated one after another from the vapor deposition source, and the hole injection layer 18, the hole transport layer 19, the light-emitting layer 16, the electron transport layer 14, and the electron injection layer 13 are layered so as to form the organic layer 7 on the first electrode 6 that is also the pixel area.

Then, as shown in FIG. 5, by forming the second electrode 8 on the organic layer 7, the organic EL element 4 provided with the first electrode 6, the organic layer 7, and the second electrode 8 is formed on the insulating substrate 2.

As for the evaporation source, a crucible having the respective evaporation materials can be used, for example. The crucible provided with a heater is disposed on the bottom portion in the chamber, and the heater heats the crucible. Then, through the heat from the heater, the internal temperature of the crucible reaches the evaporating temperature of the respective vapor deposition materials, and the respective vapor deposition materials inside the crucible become evaporated molecules and jut out in an upper direction of the chamber.

Furthermore, as for a specific example for forming the organic layer 7 and the second electrode 8, first, on the first electrode 6 patterned on the element substrate 30, the hole injection layer 18 formed of m-MTDATA(4,4,4-tris(3-methylphenylphenylamino)triphenylamine) is formed with a film thickness of 25 nm through a mask for all of the RGB pixels, for example.

Next, on the hole injection layer 18, for all RGB pixels, the hole transport layer 19 formed of α-NPD(4,4-bis(N-1-naphthyl-N-phenylamino)biphenyl) is formed so as to have a film thickness of 30 nm, for example.

Next, a mixture of 2,6-bis((4'-methoxy-diphenyl-amino) styryl)-1,5-dicyanonaphthalene (BSN) mixed with Di (2-naphthyl) anthracene (ADN) by 30 wt. % is formed with a film thickness of 30 nm on the hole transport layer 19 formed on the pixel area with a mask therebetween as the red light-emitting layer 16, for example. Next, a mixture of coumarin 6 mixed with ADN by 5 wt. % is formed with a film thickness of 30 nm on the hole transport layer 19 formed on the pixel area with a mask therebetween as the green light-emitting layer 16, for example. Next, a mixture of 4,4'-bis(2-{4-(N,N-diphenylamino)phenyl}vinyl)biphenyl (DPAVBi) mixed with ADN by 5 wt. % is formed with a film thickness of 30 nm on the hole transport layer 19 formed on the pixel area with a mask therebetween as the blue light emitting layer 16, for example. Next, on the respective light-emitting layers 16, for all of the RGB pixels, an 8-hydroxy-quinoline aluminum (Alq3) is formed as the electron transport layer 14 through a mask with film thickness of 20 nm, for example. Next, lithium floride (LiF) is formed through a mask on the electron transport layer 14 as the electron injection layer 13 that has a film thickness of 0.3 nm, for example. Then, a negative electrode formed of magnesium-silver (MgAg) is formed as a second electrode 8 with a film thickness of 10 nm, for example.

In this manner, the organic EL element 4 and the element substrate 30 having the first wall member 22 are manufactured.

<Color Filter Layer/Second Wall Member Forming Process>

Figure 6:
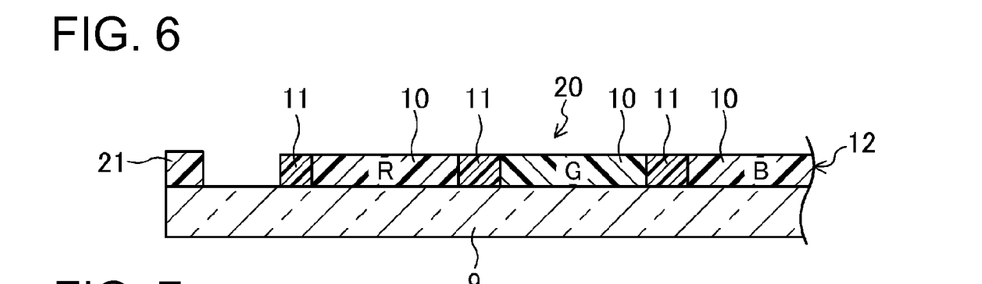
FIG. 6 is a cross-sectional view for describing the manufacturing process of an organic EL display device according to Embodiment 1 of the present invention.

First, as shown in FIG. 6, a glass substrate is prepared as the insulating substrate 9, for example. Next, a positive type photosensitive resin that has black pigment such as carbon particulate dispersed therein is applied onto the entire substrate of the insulating substrate 9 with the spin coating method, for example.

Then, as shown in FIG. 6, after the photosensitive resin is exposed through a photomask, patterning is performed by development and applying heat, and the black matrix 11 and the second wall member 21 are formed with a thickness of 2.5 μm on the insulating substrate 9, for example.

Next, on the substrate where the black matrix 11 is formed, an acrylic photosensitive resin colored in red, green, or blue is applied, and after the photosensitive resin is exposed through the photomask, patterning is performed by development, and the colored layer (red layer R, for example) 10 with a selected color is formed 2.5 μm thick, for example. Furthermore, as shown in FIG. 6, a similar process is repeated for the two other colors, and the colored portions of the two other colors (green portion G and blue portion B, for example) 10 are formed 2.5 μm thick, and a color filter 12 provided with colored portions (red portion R, green portion G, and blue portion B) 10 is formed, for example.

Next, on the color filter layer 12 formed on the insulating substrate 9, the color filter layer 12 and the sealing substrate 20 provided with the second wall member 21 are formed by patterning the common electrode.

In this manner, in the present embodiment, the second wall member 21 can be formed simultaneously when the color filter layer 12 is formed, and thus the second wall member 21 can be formed without increasing the number of steps.

<Sealing Member Forming Process>

Figure 7:
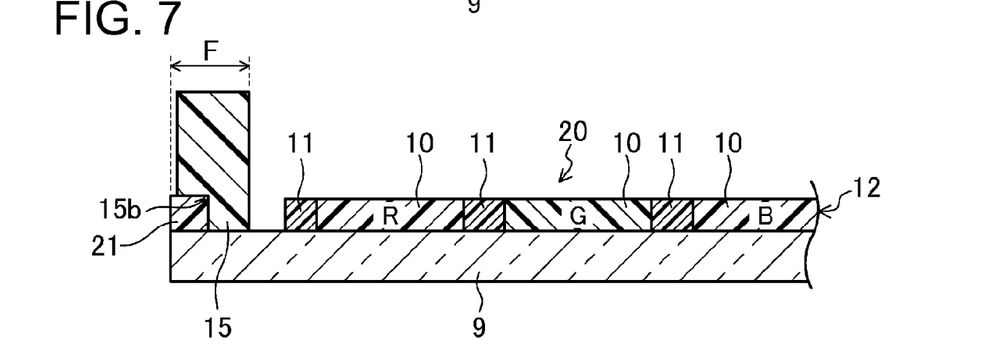
FIG. 7 is a cross-sectional view for describing the manufacturing process of an organic EL display device according to Embodiment 1 of the present invention.

Next, as shown in FIG. 7, on the sealing substrate 20, a material such as the epoxy resin is applied using a dispenser, the mask printing method, flexo printing, or the like to form the sealing member 15 in a frame shape with a height of 10 μm and a width of 1 mm, for example.

At this time, as shown in FIG. 7, in the frame region F, the sealing member 15 is formed so as to be adjacent to the second wall member 21 constituting the wall member 17, and the level difference 15b is formed on the sealing member 15 by the second wall member 21.

<Making Bonded Member>

Figure 8:
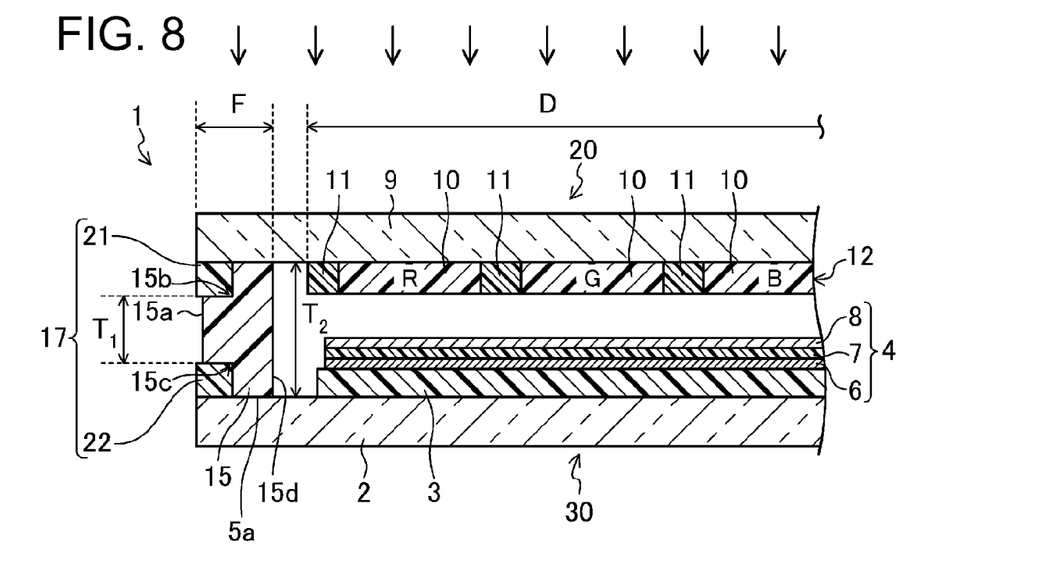
FIG. 8 is a cross-sectional view for describing the manufacturing process of an organic EL display device according to Embodiment 1 of the present invention.

Next, as shown in FIG. 8, the element substrate 30 having the organic EL elements 4 and the sealing substrate 20 having the sealing member 15 are bonded together through the sealing member 15 in a vacuum atmosphere. This is done by the sealing substrate 20 overlapping the element substrate 30 such that the organic EL element 4 and the color filter layer 12 overlap in the display region D and the outer face 15a of the sealing member 15 is sandwiched by the first wall member 22 and the second wall member 21, and the surface 5a of the sealing member 15 formed on the sealing substrate 20 is mounted on the element substrate 30.

At this time, as shown in FIG. 8, in the frame region F, the sealing member 15 is disposed so as to be adjacent to the first wall member 22 constituting the wall member 17, and the level difference 15c is formed in the sealing member 15 by the first wall member 22.

Next, after ultraviolet rays (arrow in FIG. 8) are radiated from the sealing substrate 20 side onto the sealing member 15 that is sandwiched by the element substrate 30 and the sealing substrate 20, the bonded member is heated, causing the sealing member 15 to harden, thereby manufacturing the organic EL display device 1 shown in FIG. 2.

At this time, as mentioned above, in the frame region F of the organic EL display device 1, the wall member 17 forming the level differences 15b and 15c in the sealing member 15 is provided so as to be adjacent to the outer face 15a of the sealing member 15 in a manner that the width of the outer face 15a thereof becomes smaller by sandwiching the outer face 15a of the sealing member 15.

Embodiment 2

Figure 9:
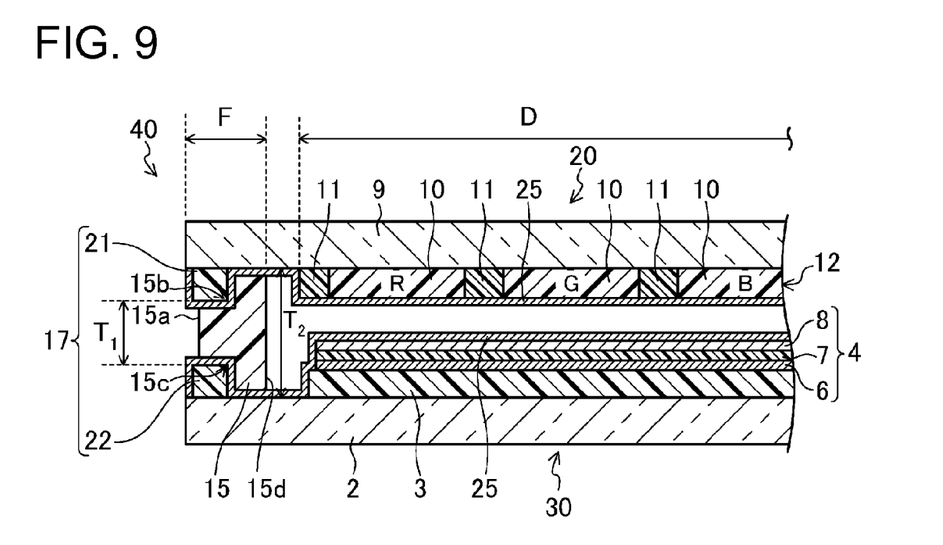
FIG. 9 is a cross-sectional view of an organic EL display device according to Embodiment 2 of the present invention.

Next, Embodiment 2 of the present invention will be described. FIG. 9 is a cross-sectional view of an organic EL display device according to Embodiment 2 of the present invention.

In the present embodiment, constituent portions similar to those of Embodiment 1 are assigned the same reference characters and descriptions thereof are omitted. Furthermore, the configuration of the entire organic EL display device and the manufacturing method thereof is similar to what was described in Embodiment 1 above, and thus, detailed descriptions thereof are omitted here.

In an organic EL display device 40 of the present embodiment, as shown in FIG. 9, an inorganic film 25 is formed between a sealing member 15 and a first wall member 22 and between the sealing member 15 and a second wall member 21.

This inorganic film 25 is formed of a silicon oxide (SiOx), a silicon nitride (SiNx), a silicon nitride oxide film (SiOxNy, x>y), or a silicon oxide nitride film (SiNxOy, x>y).

As described in Embodiment 1, an interlayer insulating film 3 is formed of an acrylic photosensitive resin or the like, and a black matrix 11 is formed of a resin material or the like having a resin material with black pigment such as carbon dispersed therein, a resin material including colored portions with colors having light transmittance, and the like, but this type of resin material in general has a high water vapor permeability coefficient.

Therefore, as in Embodiment 1, in a configuration in which the first and second wall members 21 and 22 are directly in contact with the sealing member 15, the contact area between the sealing member 15 and the air holding moisture can be reduced, but because the first and second wall members 21 and 22 come into contact with the air holding moisture, there may be a case in which the moisture absorbed by the first and second wall members 21 and 22 enter an organic EL element 4.

However, as in the present embodiment, by providing the inorganic film 25 formed of the oxide silicon or the like between the sealing member 15 and the first wall member 22 and between the sealing member 15 and the second wall member 21, then the inorganic film 25 can prevent moisture absorbed by the first and the second wall member 21 and 22 from entering. Therefore, the characteristic degradation of the organic EL element 4 caused by moisture can be further prevented for a long period of time.

The inorganic film 25 can be formed using sputtering or chemical vapor disposition (CVD).

It is preferable that the thickness of the inorganic film 25 be 50 nm to 1000 nm from the perspective of reliably preventing characteristic degradation of the organic EL element 4 without increasing the thickness of the inorganic film 25.

Furthermore, when manufacturing the organic EL display device 40 of the present embodiment, after the forming process of the organic EL element explained in Embodiment 1, the inorganic film 25 is formed on a surface of the organic EL element 4 and on a surface of the first wall member 22 using a known method such as sputtering or chemical vapor disposition (CVD). Furthermore, in a manner similar to Embodiment 1, after the process of forming the color filter layer and the second wall member, the inorganic film 25 is formed on a surface of the color filter layer 12 and on a surface of the second wall member 21 by a known method such as sputtering and chemical vapor disposition (CVD).

The embodiments above may be modified in the following manner.

Figure 10:
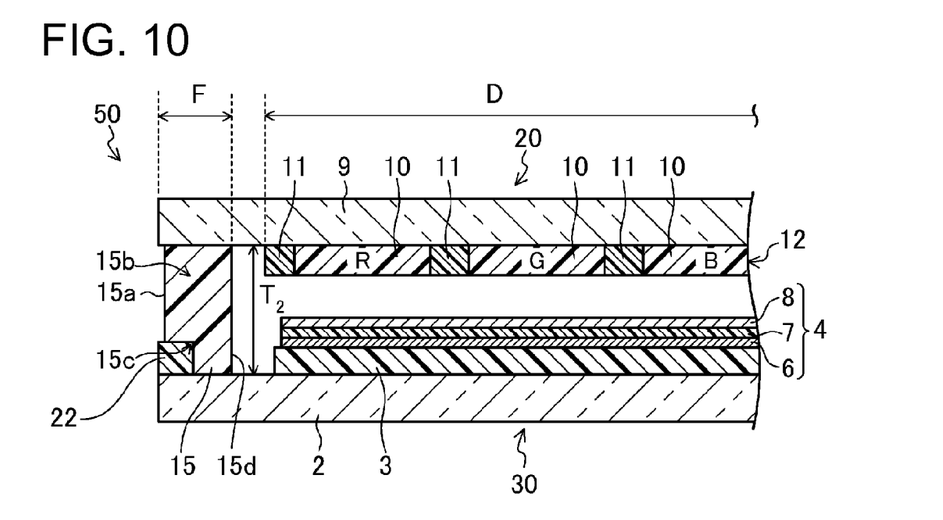
FIG. 10 is a cross-sectional view of an organic EL display device according to a modification example of the present invention.
Figure 11:
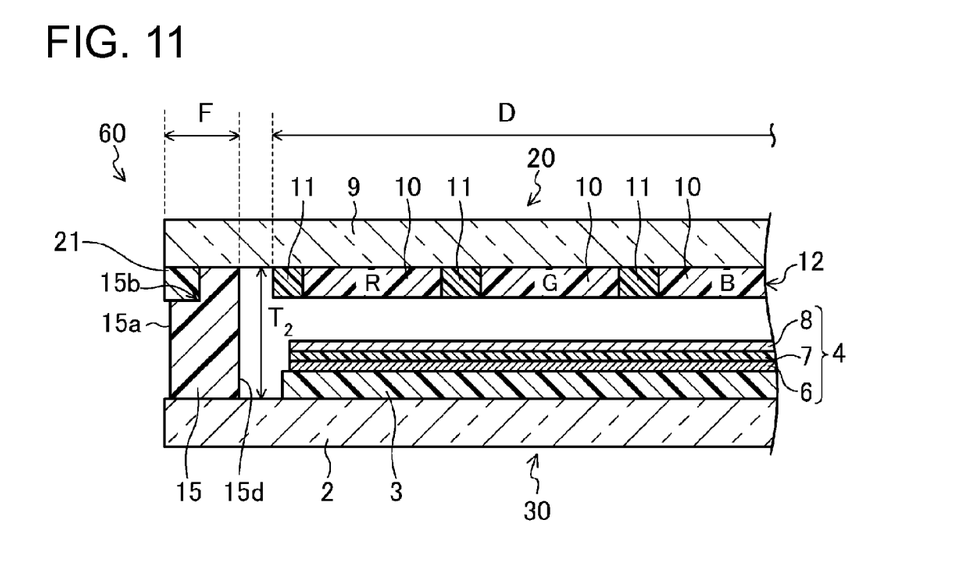
FIG. 11 is a cross-sectional view of an organic EL display device according to a modification example of the present invention.

In the respective embodiments above, the configuration has the wall member 17 formed of the first and second wall members 21 and 22, but the configuration may only have the first wall member 22 as shown in an organic EL display device 50 in FIG. 10, or the configuration may be only provided with the second wall member 21 like an organic EL display device 60 shown in FIG. 11.

In other words, it is only necessary that the wall member embedded in a portion of the outer face 15a of the sealing member 15 is formed such that, in at least one of the element substrate 30 side or the sealing substrate 20 side of the frame region F, the portion of the sealing member 15 exposed to the air becomes small. With this type of configuration, it is possible to obtain a similar effect to Embodiment 1.

Furthermore, in the organic EL display device 50 shown in FIG. 10, the inorganic film 25 is formed between the sealing member 15 and the first wall member 22, and furthermore, in a similar manner, in the organic EL display device 60 shown in FIG. 11, a similar effect to Embodiment 2 mentioned above can be obtained by providing the inorganic film 25 between the sealing member 15 and the second wall member 21.

However, as in Embodiment 1 mentioned above, by providing the wall member 17 formed of the first and second wall members 21 and 22, compared to if only the first wall member 22 or if only the second wall member 21 is provided, the height $T_1$ of the outer face 15a side of the sealing member 15 can be further reduced, and thus it is possible to further reduce the contact area between the sealing member 15 and the air holding moisture. Therefore, it is possible to further prolong the time needed for the amount of vapor in the sealing member 15 to reach its limit (saturated vapor).

Figure 12:
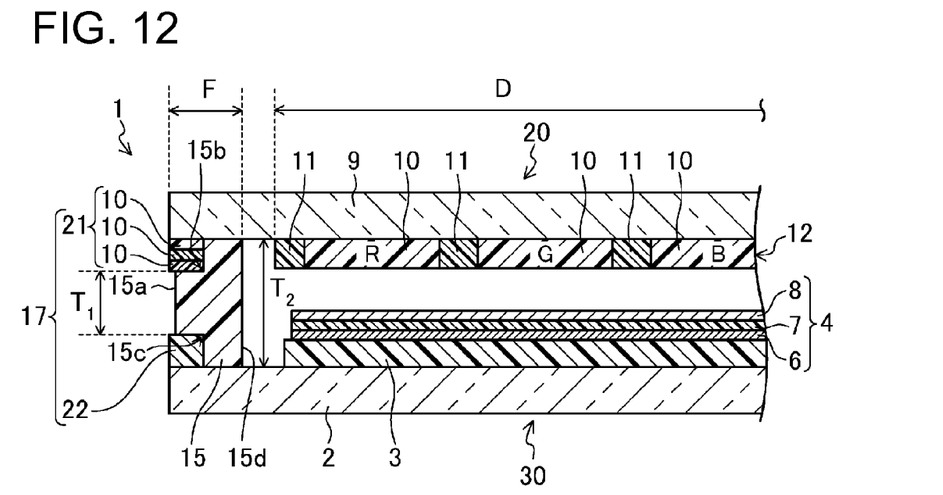
FIG. 12 is a cross-sectional view of an organic EL display device according to a modification example of the present invention.

Furthermore, in the configuration of the respective embodiments mentioned above, the material forming the black matrix 11 was used to form the second wall member 21, but as shown in FIG. 12, the black matrix 11 can be formed by stacking the material (acrylic photosensitive resin, for example) used to form the colored portions 10 with three colors forming the color filter layer 12 (red portion R, green portion G, and blue portion B, for example).

In this case, in the process of forming the color filter layer and the second wall member, an acrylic photosensitive resin colored in red, green, or blue is applied to the substrate on which the black matrix 11 is formed, and after the applied photosensitive resin is exposed through the photomask, patterning is performed by development, and the color filter layer 12 having colored portions (red portions R, green portions G, and blue portions B, for example) 10, and the second wall member 21 including the colored portions 10 is formed In this manner, in the present embodiment, the second wall member 21 can be formed simultaneously when the colored portions 10 are formed as in the embodiment mentioned above, and thus the second wall member 21 can be formed without increasing the number of steps.

The second wall member 21 may be formed by stacking the material forming the black matrix 11 and the material forming the colored portions (red portions R, green portions G, and blue portions B) 10 with three colors.

INDUSTRIAL APPLICABILITY

As explained above, the present invention is suitable for an organic EL display device provided with an organic EL element.

DESCRIPTION OF REFERENCE CHARACTERS 1 organic EL display device
2 insulating substrate (first substrate)
3 interlayer insulating film
4 organic EL element
6 first electrode
7 organic layer
8 second electrode
9 insulating substrate (second substrate)
11 black matrix
12 color filter layer
15 sealing member
15a outer face of the sealing member
15b level difference of the sealing member
15c level difference of the sealing member
17 wall member
18 nanoparticle
20 sealing substrate
21 second wall member
22 first wall member
25 inorganic film
30 element substrate
40 organic EL display device
50 organic EL display device
60 organic EL display device

What is claimed is:

1. An organic electroluminescent display device, comprising:
a first substrate;
a second substrate facing the first substrate;
an organic electroluminescent element formed on the first substrate on a side facing the second substrate;
a sealing member sandwiched between the first substrate and the second substrate to bond the first substrate to the second substrate, the sealing member being disposed in a frame region that is defined at a periphery of a display region of the organic electroluminescent display device performing image display; and
a wall member provided on said first substrate in the frame region, the wall member being attached to an outer face of the sealing member so as to form a level difference in height of the sealing member such that a vertical length of the sealing member exposed to an exterior from the wall member is shorter than an entire height of the sealing member between the first substrate and the second substrate,
wherein an interlayer insulating film is further provided between the first substrate and the organic electroluminescent element such that there is a gap between the wall member and an edge of the interlayer insulating film, said sealing member not covering an entirety of said gap in a plan view.

2. The organic electroluminescent display device according to claim 1,
wherein the wall member is provided on each of the first and second substrates, respectively designated as a first wall member provided on the first substrate and a second wall member on the second substrate, and
wherein the outer face of the sealing member is sandwiched by the first wall member and the second wall member.

3. The organic electroluminescent display device according to claim 2,
wherein the first wall member is formed of a material used to form the interlayer insulating film.

4. The organic electroluminescent display device according to claim 3, further comprising a colored layer and a black matrix disposed on the second substrate on a side facing the organic electroluminescent element,
wherein the second wall member is formed of a material forming the colored layer or the black matrix.

5. The organic electroluminescent display device according to claim 4, further comprising: an inorganic film interposed between the sealing member and the first wall member; and another inorganic film interposed between said sealing member and the second wall member.

6. The organic electroluminescent display device according to claim 5, wherein said inorganic film is formed of one material chosen from a group consisting of silicon oxide, silicon nitride, silicon nitride oxide, and silicon oxide nitride.

7. The organic electroluminescent display device according to claim 3, further comprising: an inorganic film interposed between the sealing member and the first wall member; and another inorganic film interposed between said sealing member and the second wall member.

8. The organic electroluminescent display device according to claim 7, wherein said inorganic film is formed of one material chosen from a group consisting of silicon oxide, silicon nitride, silicon nitride oxide, and silicon oxide nitride.

9. The organic electroluminescent display device according to claim 2, further comprising a colored layer and a black matrix disposed on the second substrate on a side facing the organic electroluminescent element,
wherein the second wall member is formed of a material forming the colored layer or the black matrix.

10. The organic electroluminescent display device according to claim 9, further comprising: an inorganic film interposed between the sealing member and the first wall member; and another inorganic film interposed between said sealing member and the second wall member.

11. The organic electroluminescent display device according to claim 10, wherein said inorganic film is formed of one material chosen from a group consisting of silicon oxide, silicon nitride, silicon nitride oxide, and silicon oxide nitride.

12. The organic electroluminescent display device according to claim 2, further comprising: an inorganic film interposed between the sealing member and the first wall member and another inorganic film interposed between said sealing member and the second wall member.

13. The organic electroluminescent display device according to claim 12, wherein said inorganic film is formed of one material chosen from a group consisting of silicon oxide, silicon nitride, silicon nitride oxide, and silicon oxide nitride.

14. An organic electroluminescent display device, comprising:
a first substrate;
a second substrate facing the first substrate;
an organic electroluminescent element formed on the first substrate on a side facing the second substrate;
a sealing member sandwiched between the first substrate and the second substrate to bond the first substrate to the second substrate, the sealing member being disposed in a frame region that is defined at a periphery of a display region of the organic electroluminescent display device performing image display; and
a wall member provided on said second substrate in the frame region, the wall member being attached to an outer face of the sealing member so as to form a level difference in height of the sealing member such that a vertical length of the sealing member exposed to an exterior from the wall member is shorter than an entire height of the sealing member between the first substrate and the second substrate,
wherein a colored layer and a black matrix are further disposed on the second substrate on a side facing the organic electroluminescent element such that there is a gap between the wall member and an edge of the colored layer and the black matrix, said sealing member not covering an entirety of said gap in a plan view.

15. The organic electroluminescent display device according to claim 14, further comprising: an inorganic film interposed between the sealing member and the wall member.

16. An organic electroluminescent display device, comprising:
a first substrate;
a second substrate facing the first substrate;
an organic electroluminescent element formed on the first substrate on a side facing the second substrate;
a sealing member sandwiched between the first substrate and the second substrate to bond the first substrate to the second substrate, the sealing member being disposed in a frame region that is defined at a periphery of a display region of the organic electroluminescent display device performing image display; and
a wall member provided on at least one of said first substrate in the frame region and said second substrate in the frame region, the wall member being attached to an outer face of the sealing member so as to form a level difference in height of the sealing member such that a vertical length of the sealing member exposed to an exterior from the wall member is shorter than an entire height of the sealing member between the first substrate and the second substrate,
wherein an inorganic film is interposed between the sealing member and the wall member such that said inorganic film covers an inner sidewall of the wall member at a side of the organic electroluminescent element and covers an outer sidewall of the wall member opposite thereto.

17. The organic electroluminescent display device according to claim 16,
wherein the wall member is provided on the first substrate in the frame region, and
wherein an interlayer insulating film is further provided between the first substrate and the organic electroluminescent element such that there is a gap between the wall member and an edge of the interlayer insulating film, said sealing member not covering an entirety of said gap in a plan view.

18. The organic electroluminescent display device according to claim 16,
wherein the wall member is provided on the second substrate in the frame region, and
wherein a colored layer and a black matrix are further disposed on the second substrate on a side facing the organic electroluminescent element such that there is a gap between the wall member and an edge of the colored layer and the black matrix, said sealing member not covering an entirety of said gap in a plan view.

* * * * *